United States Patent [19]

Castleberry et al.

[11] 4,161,766
[45] Jul. 17, 1979

[54] LAMINATED CAPACITIVE TOUCH-PAD

[75] Inventors: Donald E. Castleberry, Schenectady; Wesley K. Waldron, Scotia, both of N.Y.

[73] Assignee: General Electric Company, Schenectady, N.Y.

[21] Appl. No.: 799,298

[22] Filed: May 23, 1977

[51] Int. Cl.² ............................................. H01G 7/00
[52] U.S. Cl. ............................. 361/280; 200/DIG. 1; 200/52 R; 361/281; 361/330
[58] Field of Search ............... 361/280, 281, 330, 303; 200/DIG. 1, 52 R; 340/365 C; 324/61 R

[56] References Cited
U.S. PATENT DOCUMENTS

| | | | |
|---|---|---|---|
| 3,253,199 | 5/1966 | Cozens | 361/330 X |
| 3,492,440 | 1/1970 | Cerbone | 200/DIG. 1 X |
| 3,745,508 | 7/1973 | Bruder | 361/330 |
| 3,951,250 | 4/1976 | Pointon | 340/365 C |
| 4,016,490 | 4/1977 | Weckenmann | 200/DIG. 1 X |
| 4,123,631 | 10/1978 | Lewis | 200/DIG. 1 |

FOREIGN PATENT DOCUMENTS

| | | | |
|---|---|---|---|
| 1197561 | 7/1965 | Fed. Rep. of Germany | 361/303 |
| 811295 | 4/1959 | United Kingdom | 361/303 |
| 828434 | 2/1960 | United Kingdom | 361/322 |

*Primary Examiner*—E. A. Goldberg
*Attorney, Agent, or Firm*—Geoffrey H. Krauss; Joseph T. Cohen; Marvin Snyder

[57] ABSTRACT

A laminated capacitive touch-pad having a thin film touch-plate electrode deposited upon a first (exterior) surface of a first, relatively thin dielectric layer and having spaced transmitter and receiver electrodes deposited upon a second surface of the first layer within the outline of and opposite to the touch electrode, with a relatively thick backing layer of dielectric material laminated upon the second surface to provide a total thickness, as measured between the furthest opposed surfaces of the first and second layers, as required for high voltage insulation purposes and to provide additional impact strength. The touch, transmitter and receiver electrodes may be of thin film construction.

9 Claims, 4 Drawing Figures

LAMINATED CAPACITIVE TOUCH-PAD

BACKGROUND OF THE INVENTION

The present invention relates to capacitive touch-pads and, more particularly, to a novel laminated capacitive touch-pad providing greater dielectric coupling between touch plate and transmit and receive electrodes thus greatly enhancing the ratio of desired coupling capacitance to parasitic coupling between transmit and receive electrodes while maintaining required high voltage insulation parameters and facilitating a greater total dielectric thickness which is required in some applications.

Touch-pads capable of changing capacitance, when approached or contacted, are well known. Capacitive touch-pads are often used in high voltage environments where relatively thick dielectrics are required for safety purposes; the value of a parasitic capacity between a pair of spaced transmitting and receiving electrodes, fabricated upon a first surface of a relatively thick dielectric substrate, often approaches the capacitance value between each of the electrodes and a touch-pad electrode fabricated upon the remaining surface of the substrate, whereby erroneous signals are frequently generated. The problem is compounded when arrays of discrete touch-pad devices are utilized; the separation distance between each device in the array and all other adjacent devices must be relatively great to prevent additional parasitic capacitance, and the associated signal leakage attributable thereto, from totally masking the desired change in signal when the touch electrode is approached and/or contacted. A capacitive touch-pad having a relatively large ratio of desired coupling capacity to parasitic capacity, yet retaining a relatively thick dielectric for safety reasons in high voltage environments, is desirable.

BRIEF DESCRIPTION OF THE INVENTION

A laminated capacitive touch-pad, in accordance with the invention, has a first, relatively thin dielectric layer having a conductive touch electrode fabricated upon an exterior surface thereof and has a transmitting electrode and a receiving electrode fabricated, within the outline of the touch-pad, upon the remaining substrate surface. A second layer of dielectric material, of relatively greater thickness with respect to the thickness of the first layer, is laminated against the surface of the first layer bearing the spatially separated transmitting and receiving electrodes to achieve a total dielectric thickness as required for safety reasons, while having a dielectric thickness between the touch electrodes and the transmitting and receiving electrodes of relatively small dimension to cause the touch-pad capacity to be relatively greater than the parasitic capacity between transmitting and receiving electrodes, thereby preventing erroneous signal generation, even when a plurality of the laminated capacitive touch-pads are arrayed with relatively small separation distances therebetween.

In a preferred embodiment of the invention, the electrodes are fabricated by thin film deposition techniques; the receiving and transmitting electrode leads are of the thin film type and are integrally fabricated with the electrodes. Thick film leads and electrodes may also be utilized.

Accordingly, it is one object of the present invention to provide a novel capacitive touch-pad having a relatively large dielectric thickness while minimizing parasitic capacitance effects.

It is another object of the present invention to provide a novel capacitive touch-pad having laminated dielectric layers.

It is a further object of the present invention to provide a laminated capacitive touch-pad having thin film electrodes.

These and other objects of the present invention will become apparent upon consideration of the following detailed description and accompanying drawings.

DETAILED DESCRIPTION OF THE PRESENT INVENTION

Figure 1A:
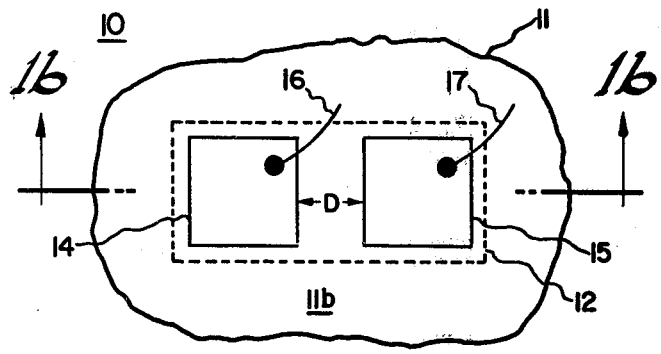
FIGS. 1a and 1b are respectively plan and sectional views of a prior art capacitive touch-pad.
Figure 1B:
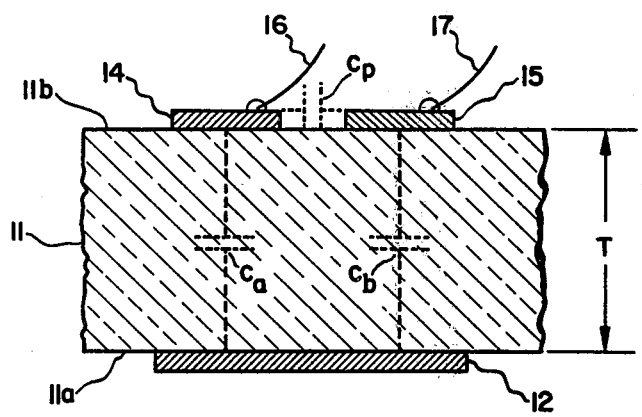

Referring initially to FIGS. 1a and 1b, a prior art capacitive touch-pad 10 comprises a dielectric substrate 11, upon a front, or outwardly-facing, surface 11a of which is fabricated a touch electrode 12 of conductive or semiconductive material and having a preselected boundary, herein illustrated as being of rectangular shape. A pair of electrodes 14 and 15, commonly referred to as a transmitting electrode and a receiving electrode, respectively, are fabricated of a conductive or semiconductive material upon the remaining, inwardly-facing surface 11b of the substrate. Both transmitting and receiving electrodes 14 and 15 are typically of substantially smaller area than, and are positioned substantially within the boundaries of, the area of touch electrode 12. The closest points between transmitting and receiving electrodes 14 and 15 are separated by a preselected distance D, while each of electrodes 14 and 15 are separated from touch electrode 12 by a preselected dielectric thickness T, derived in accordance with the insulation characteristics to be achieved. Each of transmitting and receiving electrodes 14 and 15 have an associated conductive lead wire 16 and 17, respectively, coupled to a point thereon for connection of the touch-pad to known circuitry (not shown for purposes of simplicity) configured to drive the transmitting electrode with a periodically-varying waveform and to recognize a change in the peak amplitude of that waveform at the receiving electrode as the effective series coupling impedance between transmitting and receiving electrodes varies when touch electrode 12 is approached and/or contacted.

In situations where relatively large values of dielectric thickness T are required, to protect personnel contacting touch electrode 12 from high voltages present in apparatus adjacent substrate rear surface 11b, the relative magnitude of a parasitic capacity $C_P$ (between the facing surfaces of the transmitting and receiving electrodes 14 and 15 separated by the relatively small distance D), approaches the magnitude of the desired series capacity C ($C = C_a C_b/(C_a + C_b)$) between electrodes 14 and 15 via touch electrode 12. Similarly, when arrays of a plurality of such touch-pads are positioned with relatively close spacing, the transmitting electrode of one touch-pad is positioned relatively close to the receiving electrode of an adjacent touch-pad, whereby the magnitude of the pad-to-pad parasitic capacities approach the magnitude of electrode capacity through the substrate. These and other parasitic capacities cause relatively large coupling between transmitting and receiving electrodes leading to the generation of erroneous signals which are not always easily identified or rejected. The coupling problem is even more severe where the value of the touch-pad capacitor C is small due to increasingly greater dielectric thickness T. In many circumstances, dielectric thickness and the distance separating individual touch-pads of an array are configured, in high density arrays, such that device and parasitic capacitances are substantially equal and allow a signal, introduced into the transmitting electrode 14, to have substantial equal coupling to receiving electrode 15 through either the parasitic or the intended capacitance path.

Figure 2A:
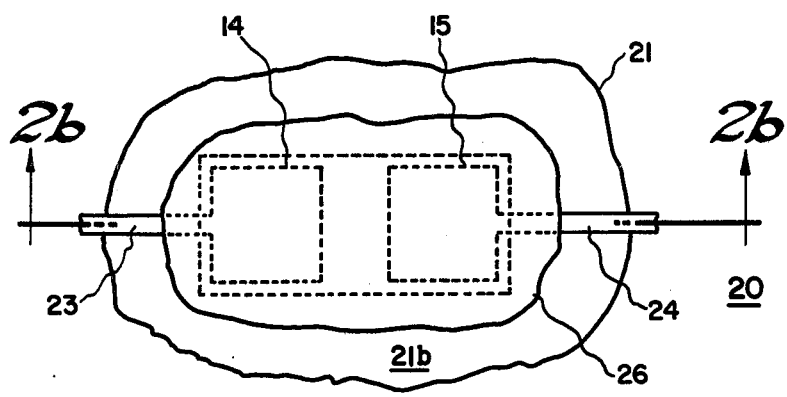
FIGS. 2a and 2b are respectively plan and sectional views of a laminated capacitive touch-pad in accordance with the principles of the present invention.
Figure 2B:
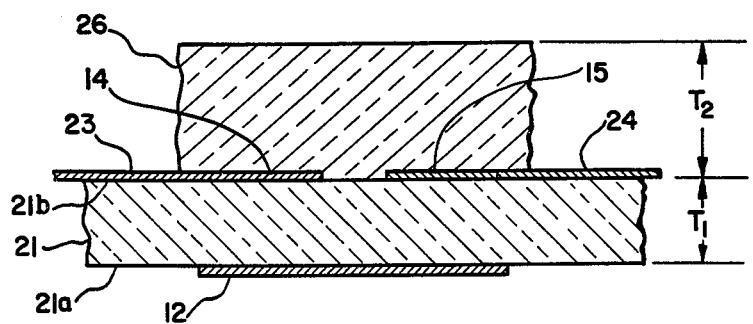

In accordance with the invention, a capacitive touch-pad 20 (FIGS. 2a and 2b) essentially overcoming the above problems of parasitic capacitance, while maintaining the required total thickness T of a dielectric material, comprises a first dielectric substrate 21 of a relatively small thickness $T_1$, upon a front, or outwardly-facing, surface 21a of which is fabricated touch electrode 12. The spatially separated transmitting and receiving electrodes 14 and 15, respectively, are fabricated upon the remaining, or inwardly-facing, surface 21b of first dielectric layer 21 and may be formed, in one preferred embodiment, by thin film fabrication techniques. It should be understood that touch electrode 12 may also be fabricated by thin film techniques. The electrodes and leads may also be fabricated as thick films, if desired, in a particular application.

Lead means 23 and 24 each respectively associated with respective transmitting and receiving electrodes 14 and 15, are advantageously fabricated by thin film techniques, at the same time as the transmitting and receiving electrodes are themselves fabricated, whereby the members forming lead means 23 and 24 are integrally joined to their respective electrodes.

A second layer 26 of dielectric material is fabricated to a thickness $T_2$, which may be equal to, or different from, the thickness $T_1$ of first layer 21. Layer 26 is laminated against the inwardly-facing surface 21b of the first dielectric layer, and the transmitting and receiving electrodes fabricated thereon. Thus, the total thickness $(T_2+T_1)$ of the dielectric insulation of our novel laminated touch-pad is easily established to be equal to the total dielectric insulation thickness T of the prior art touch-pad 10, yet the total separation distance $T_1$ between each of transmitting and receiving electrodes 14 and 15, respectively, and overlying touch electrode 12 is substantially reduced over the prior art embodiment, whereby the value of each series capacitance (between transmitting electrode 14 and touch electrode 12 and between touch electrode 12 and receiving electrode 15) is substantially increased and is relatively greater than the parasitic capacity between transmitting and receiving electrodes of a single touch-pad or the parasitic capacitance between electrodes of adjacent touch-pads in high density arrays. The relatively greater magnitude of signal current enabled between transmitting and receiving electrodes via the series path (through the touch-plate), as opposed to the parasitic path, enables touch-pad arrays of greater density than hitherto possible. Use of spacing similar to the array spacing achieved in prior art displays allows relatively lower amplitudes of the waveform driving the transmitting electrode to be used, due to the increased magnitude of the desired signal coupled between electrodes 14 and 15, via Ca, Cb and the touch plate electrode. Thus, lower implementation cost of associated driving and sensing circuitry is facilitated by reducing driving signal magnitude and the difficulty of sensing false signals.

While the present invention has been described with reference to one preferred embodiment thereof, many variations and modifications will now become apparent to those skilled in the art. It is our intent, therefore, to be limited solely by the scope of the appending claims.

What is claimed is:

1. A capacitive touch-pad comprising:
    a first layer of dielectric material having first and second surfaces, said first surface being outwardly facing and exposed to an external environment;
    a first electrode fabricated upon said first surface to be exposed to said external environment and responsive to contact with a human body member;
    a pair of spatially separated second and third electrodes fabricated upon said second surface substantially within the boundaries of said first electrode; and
    a second layer of rigid dielectric material laminated to said second surface in abutment with said second and third electrodes;
    said first layer having a thickness predeterminately selected to cause an electrical capacitance between each of said second and third electrodes and said first electrode to be greater than the parasitic capacitance between said first and second electrodes.

2. A touch-pad as set forth in claim 1, wherein said second layer has a thickness chosen to cause the total thickness between furthest opposed surfaces of said first and second layers to equal a selected total thickness.

3. A touch-pad as set forth in claim 2, wherein the thicknesses of said first and second layers are substantially equal.

4. A touch-pad as set forth in claim 2, wherein the thickness of said first layer is substantially less than the thickness of said second layer.

5. A touch-pad as set forth in claim 1 wherein said second and third electrodes are each members of one of the group consisting of a conductive material film and a semiconductive material film.

6. A touch-pad as set forth in claim 5, further comprising lead means coupled to each of said second and third electrodes.

7. A touch-pad as set forth in claim 6, wherein each of said lead means is a film member fabricated upon said second surface and having an end thereof in electrical contact with the associated one of said third and second electrodes.

8. A touch-pad as set forth in claim 7, wherein said second and third electrodes and the associated lead means are fabricated to the same thickness upon said second surface.

9. A touch-pad as set forth in claim 5, wherein said first electrode is a film member fabricated upon said first surface.

* * * * *